US012595558B2

(12) United States Patent
Fischer, III et al.

(10) Patent No.: US 12,595,558 B2
(45) Date of Patent: Apr. 7, 2026

(54) METHOD OF MAKING COMPOSITE ARTICLES FROM SILICON CARBIDE

(71) Applicant: Advanced Silicon Carbide Materials, Linue, HI (US)

(72) Inventors: William F. Fischer, III, Clarks Green, PA (US); Walter Wrigglesworth, III, Cotopaxi, CO (US); Lauren Montgomery, Lihue, HI (US)

(73) Assignee: ADVANCED SILICON CARBIDE MATERIALS, Linue, HI (US)

( * ) Notice: Subject to any disclaimer, the term of this patent is extended or adjusted under 35 U.S.C. 154(b) by 856 days.

(21) Appl. No.: 17/731,458

(22) Filed: Apr. 28, 2022

(65) Prior Publication Data
US 2022/0251702 A1    Aug. 11, 2022

Related U.S. Application Data

(63) Continuation of application No. 16/533,129, filed on Aug. 6, 2019, now Pat. No. 11,319,629.

(60) Provisional application No. 62/714,890, filed on Aug. 6, 2018.

(51) Int. Cl.
| | |
|---|---|
| *C23C 16/32* | (2006.01) |
| *C23C 16/56* | (2006.01) |
| *G02B 5/08* | (2006.01) |
| *G21K 1/06* | (2006.01) |

(52) U.S. Cl.
CPC ............ *C23C 16/325* (2013.01); *C23C 16/56* (2013.01); *G02B 5/0891* (2013.01); *G21K 1/06* (2013.01)

(58) Field of Classification Search
CPC ............................. C23C 16/325; G02B 5/0891
See application file for complete search history.

(56) References Cited

U.S. PATENT DOCUMENTS

| | | | |
|---|---|---|---|
| 5,154,862 | A | 10/1992 | Reagan et al. |
| 5,348,765 | A | 9/1994 | Reagan et al. |
| 7,018,947 | B2 | 3/2006 | Goela et al. |
| 2006/0057287 | A1 | 3/2006 | Foss et al. |
| 2010/0328762 | A1 | 12/2010 | Goodman et al. |
| 2011/0221084 | A1 | 9/2011 | Goodman et al. |
| 2016/0024648 | A1 | 1/2016 | Bolton et al. |
| 2017/0241016 | A1 | 8/2017 | Bolton et al. |

*Primary Examiner* — Katherine A Christy
(74) *Attorney, Agent, or Firm* — Dentons Cohen & Grigsby, P.C.; Michael E. Dukes

(57) ABSTRACT

A transparent composite article may include a first domed surface having a first integral freeform mirror and an opposed second surface having a second integral freeform primary mirror and supporting the first domed surface. The first domed surface and opposed domed surface may include a chemical vapor deposition (CVD) matrix. The CVD matrix may include a silicon carbide material. The CVD matrix may be transparent to visible light. The CVD matrix may include a columnar grain structure.

20 Claims, 5 Drawing Sheets

SIC Dome with integral freeform secondary

Integral Freeform secondary mirror surface

Integral Freeform Primary Mirror surface

Dome to Bulkhead mounting surfaces

SIC Bulkhead with integral freeform primary

SIC Dome with integral freeform secondary

Integral Freeform secondary mirror surface

Integral Freeform Primary Mirror surface

Dome to Bulkhead mounting surfaces

SIC Bulkhead with integral freeform primary

METHOD OF MAKING COMPOSITE ARTICLES FROM SILICON CARBIDE

CROSS REFERENCE TO RELATED APPLICATION

This application is a continuation of U.S. patent application Ser. No. 16/533,129, filed Aug. 6, 2019, now U.S. Pat. No. 11,319,629, which claims the benefit of U.S. Provisional Application No. 62/714,890, filed on Aug. 6, 2018, each of which is incorporated herein by reference in its entirety.

FIELD OF INVENTION

This disclosure generally relates to silicon carbide (SiC) composite articles, and in particular to SiC composite optics (mirrors), and methods of making and using the same.

BACKGROUND

Silicon carbide, also known as carborundum, is a rare earth element, existing naturally in minute quantities only in the form of moissanite in certain types of meteorites and corundum deposits and kimberlite. Virtually all the silicon carbide sold in the world is synthetic. Early experiments in the synthesis of silicon carbide were conducted during the 1800's using a variety of source materials and processes. Wide scale production of silicon carbide as we know it today is credited to Edward Goodrich Acheson in 1890. Acheson patented the method for making silicon carbide powder and developed the electric batch furnace by which SiC is still made today. Acheson formed The Carborundum Company to manufacture SiC in bulk, initially for use as an abrasive, although the material be formed varied in purity. Pure silicon carbide may be made by four primary processes. The first process is known as the Lely method whereby silicon carbide powder is sublimated onto substrates comprised of the same constituents and redeposited at cooler temperatures to form SiC. The second process is by thermal decomposition of a polymer, poly(methylsilane), under an inert atmosphere at low temperatures. The third process is the chemical vapor deposition (CVD) process, which involves thermal decomposition of a high purity chemical precursor on a substrate surface. The fourth process is the chemical vapor composite (CVC) process.

Silicon carbide exists in a large number of crystalline forms all of which are variations of the same chemical compound. Alpha silicon carbide ($\alpha$-SiC), the most common form of silicon carbide, has a hexagonal crystal structure. Silicon carbide produced using CVD processes typically have a face-centered cubic crystal structure referred to as a beta silicon carbide. Silicon carbide produced using the CVC process is typically a mixture of alpha silicon carbide and beta silicon carbide.

Silicon carbide has a theoretical density of 3.21 g/cm$^3$ and is chemically inert. SiC has a high melting point (2730° C.), low coefficient of thermal expansion (CTE) and no phase transitions that would cause discontinuities in thermal expansion, making it an ideal material for high temperature and optical applications.

U.S. Pat. Nos. 5,154,862 and 5,348,765 describe a process for making silicon carbide, known as the CVC process or the CVC SiC process. In the CVC SiC process, an aerosol of solid micron-scale SiC particles is entrained within a reactant chemical vapor precursor and injected into a high temperature furnace. The aerosol mixture reacts at high temperature to form solid, high purity CVC SiC on a heated graphite substrate. The chemical process is analogous to chemical vapor deposition (CVD), which similarly uses a chemical vapor precursor, but without the added SiC particles. The key consequence of adding solid particles to the reaction stream is a unique grain structure that results in a fully dense, virtually stress-free material. Thus, CVC SiC may be characterized by one or more of: grown over 5 times faster than conventional CVD; scaled to very large sizes (up to 1.45 m diameter); manufactured thickness of at least 63 mm; deposited to near net shape; and machined to thin dimensions with reduced risk of fracture.

Other notable advantages of CVC silicon carbide may include higher stiffness, higher thermal conductivity, lower thermal expansion, lower density and/or higher specific stiffness relative to SiC made by other processes.

An important application for CVC silicon carbide is in the production of lightweight optics and optical systems. Lightweight optics are utilized in space and airborne applications for detection, surveillance, imaging and tracking. These mirrors typically include an optical quality facesheet reinforced with a ribbed backside structure to maintain mirror stiffness. The ribbed structure is produced by grinding, milling or in some way machining material away. The extensive amount of machining required to produce the lightweight mirror, compounded by the amount of bulk material that is ultimately unused, makes the manufacturing and fabrication costs of lightweight optics very high. As a solution, if the mirror material has a high stiffness to weight ratio (i.e., specific stiffness), then the thickness of the backside of the optic may be significantly reduced or eliminated, thereby reducing the cost.

Mirror materials with the highest specific stiffness are beryllium (155 MPa-m$^3$/kg) and SiC (143 Mpa-m$^3$/kg). Beryllium (Be) has been utilized extensively in airborne optics, however it is highly toxic and expensive to procure and fabricate. SiC, particularly CVC SiC, may be a highly desirable alternative to beryllium as it has one or more benefits over Be components: CVC SiC, while nearly as stiff as Be, is much more thermally stable, thus allowing CVC SiC optics to perform in low altitude, aggressive trajectory flight; components may be fabricated from CVC SiC blanks in 4-6 weeks versus a Be blank which requires 8-9 months; CVC SiC is non-toxic thereby eliminating the costs associated with managing the environmental, health, and safety procedures required in the manufacture of components from Be; CVC SiC is resistant to ionizing radiation, unlike Be; and unlike Be, CVC SiC will not corrode.

SiC also has the advantage over other mirror materials, including aluminum and glass, which are significantly less stiff than either beryllium or SiC.

Conventional CVC SiC mirror blanks have been produced with typical surface figure values of better than $\lambda$/10 P-V at 632.8 nm, surface roughness values of less than 5 Angstroms root mean squared (RMS), and an aspect ratio performance of 24:1 (aspect ratio is the diameter to thickness ratio).

Although CVC SiC optics polish extremely well, the polished surface has been observed, on rare occasions, to have micron scale imperfections. The size and geometry of these imperfections suggest that the solid SiC particles pulled out of the silicon carbide matrix during the polishing process. It is unknown whether particle pull-out is initiated by a specific polishing methodology or process as not all polishing houses observe this phenomenon (those that have given anecdotal evidence do not observe pull-out consistently). Particle pull-out results in a microscopic void (dig) in the mirror's optical surface. Such surface defects may result in light scattering, undesired diffraction patterns, loss of contrast and stray light, which can degrade image quality and affect overall optical system performance. While the occurrence of particle pull out is rare, the potential result may be significant.

Accordingly, more efficient and/or cost-effective methods of making silicon carbide composite articles may be desirable.

SUMMARY

The present invention may comprise a method to form co-deposited transparent composite articles, particularly ceramic composites, for high temperature applications. The transparent composite articles may be formed at high deposition rates from a chemical vapor deposition (CVD) matrix and a second phase of solid particles or fibers dispersed within the matrix. For example, the CVD matrix and particle reinforcing the second phase may be simultaneously built up into the desired shape through entraining of particles in a reactant gas stream. Co-depositing the CVD matrix and particles onto a substrate may generate a transparent composite article of a configuration conforming to the shape of the substrate and that is fully densified with a randomly oriented and even particle distribution.

The present invention may comprise depositing a mixture of silicon carbide particles and CVD gases onto a substrate comprising a heated graphite structure, such as a tube. Silicon carbide may be produced from the thermally activated chemical reaction occurring in the reactant gas stream and may be deposited with the silicon carbide particles on the graphite substrate followed by a heat treatment. The final article produced after removal of the substrate may comprise a co-deposited composite tube having silicon carbide particles randomly and uniformly distributed throughout the silicon carbide matrix. Since the deposited material of the co-deposited ceramic composite conforms to the substrate finish and to the geometry of the graphite structure, little or no machining may be required to produce the final composite product.

The present invention may provide a method for producing transparent composite articles from a wide variety of materials, and particularly transparent composite articles for use in high temperature, corrosive environments.

The present invention may provide a one-step method for producing near-net shaped, transparent co-deposited articles.

The present invention may provide a method for producing irregularly shaped, transparent composite articles.

The present invention may provide a method of producing transparent composite articles at high rates of co-deposition of a solid phase and a vapor phase.

DESCRIPTION OF THE DRAWINGS

The present invention may be better understood by reference to the accompanying figures, in which.

DETAILED DESCRIPTION

Figure 1:
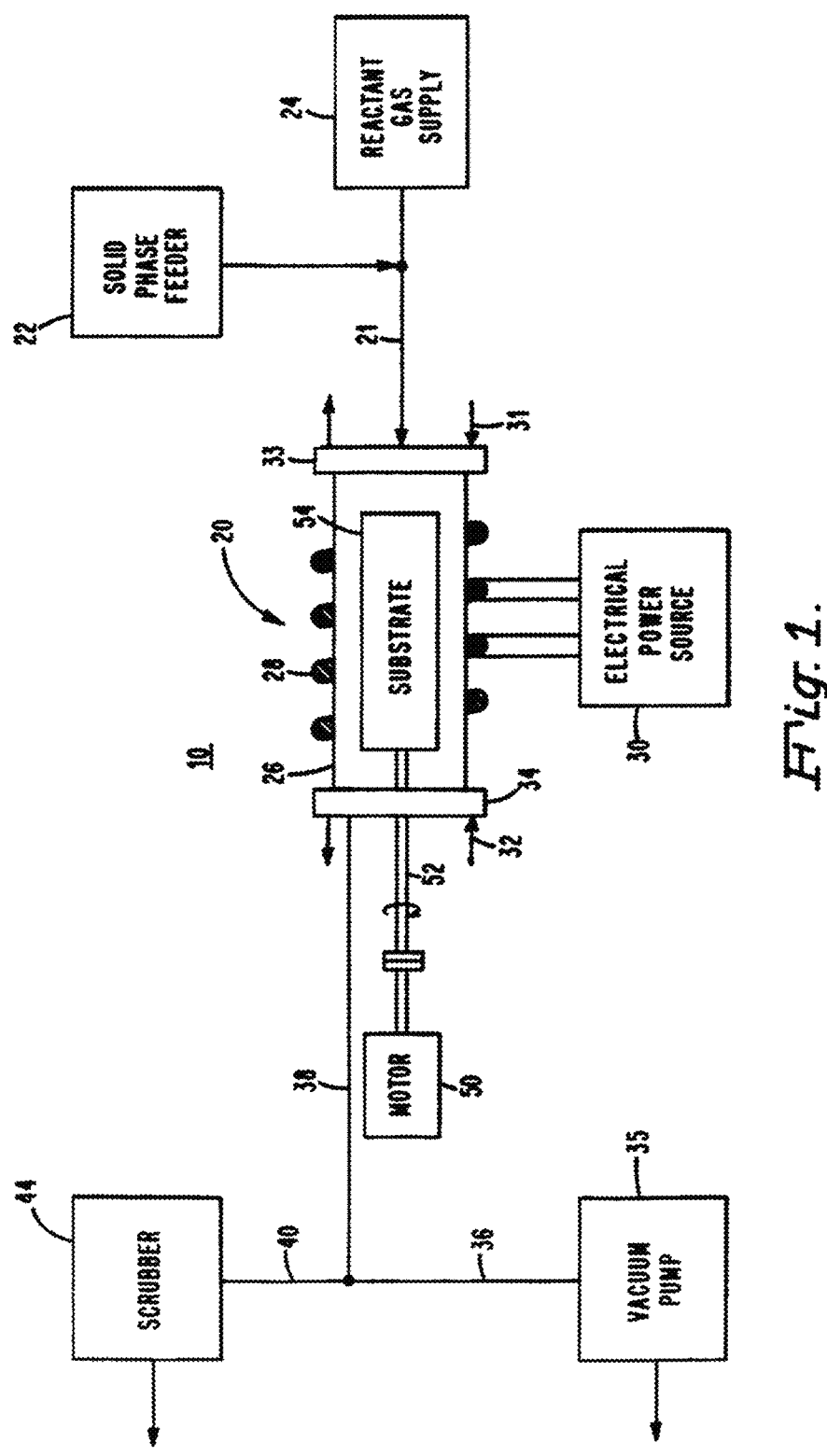
FIG. 1 is a schematic view of an apparatus for practice of the method of the invention.

This disclosure describes features, aspects, and advantages of composite articles comprising silicon carbide. It is understood, however, that this disclosure also embraces numerous alternative features, aspects, and advantages that may be accomplished by combining any of the various features, aspects, and/or advantages described herein in any combination or sub-combination that one of ordinary skill in the art may find useful. Such combinations or sub-combinations are intended to be included within the scope of this disclosure. As such, the claims may be amended to recite any features, aspects, and advantages expressly or inherently described in, or otherwise expressly or inherently supported by, this disclosure. Further, any features, aspects, and advantages that may be present in the prior art may be affirmatively disclaimed. Accordingly, this disclosure may comprise, consist of, consist essentially or be characterized by one or more of the features, aspects, and advantages described herein.

All numerical quantities stated herein are approximate, unless stated otherwise. Accordingly, the term "about" may be inferred when not expressly stated. The numerical quantities disclosed herein are to be understood as not being strictly limited to the exact numerical values recited. Instead, unless stated otherwise, each numerical value included in the present disclosure is intended to mean both the recited value and a functionally equivalent range surrounding that value. At the very least, and not as an attempt to limit the application of the doctrine of equivalents to the scope of the claims, each numerical value should at least be construed in light of the number of reported significant digits and by applying ordinary rounding techniques. Notwithstanding the approximations of numerical quantities stated herein, the numerical quantities described in specific examples of actual measured values are reported as precisely as possible. Any numerical values, however, inherently contain certain errors necessarily resulting from the standard deviation found in their respective testing measurements.

All numerical ranges stated herein include all sub-ranges subsumed therein. For example, a range of "1 to 10" or "1-10" is intended to include all sub-ranges between and including the recited minimum value of 1 and the recited maximum value of 10 because the disclosed numerical ranges are continuous and include every value between the minimum and maximum values. Any maximum numerical limitation recited herein is intended to include all lower numerical limitations. Any minimum numerical limitation recited herein is intended to include all higher numerical limitations.

In the following description, certain details are set forth in order to provide a better understanding of various features, aspects, and advantages the invention. However, one skilled in the art will understand that these features, aspects, and advantages may be practiced without these details. In other instances, well-known structures, methods, and/or techniques associated with methods of practicing the various features, aspects, and advantages may not be shown or described in detail to avoid unnecessarily obscuring descriptions of other details of the invention.

As generally used herein, the articles "one", "a", "an", and "the" include "at least one" or "one or more" of what is claimed or described, unless indicated otherwise. For example, "a component" means one or more components, and thus, possibly, more than one component is contemplated and may be employed or used in an implementation of the described embodiments.

As generally used herein, the terms "include", "includes", and "including" are meant to be non-limiting.

As generally used herein, the terms "have", "has", and "having" are meant to be non-limiting.

As generally used herein, the term "characterized by" is meant to be non-limiting.

A method of forming composite articles according to the invention may be practiced using a reactor system 10 illustrated in FIG. 1 which includes a reactor 20 to which a mixture of particles or fibers and a reactant gas is supplied along a line 21 from a solid phase feeder 22 and a reactant gas supply 24. The reactor 20 may be a quartz reactor having an outer wall 26 wrapped with an induction coil 28 connected to an electrical power source 30, and may be cooled by fans (not shown) and by cooling water introduced through appropriate lines 31 and 32 extending into end flanges 33 and 34. A vacuum pump 35 for evacuating the reactor 20 may be connected to one branch 36 of an exhaust line 38, and a second branch 40 may direct exhaust gases from the reactor 20 to a scrubber 44. A motor 50 and shaft 52 may be connected to the reactor 20 to rotate a substrate 54 within the reactor 20 to insure even co-deposition of materials on the substrate.

Figure 2:
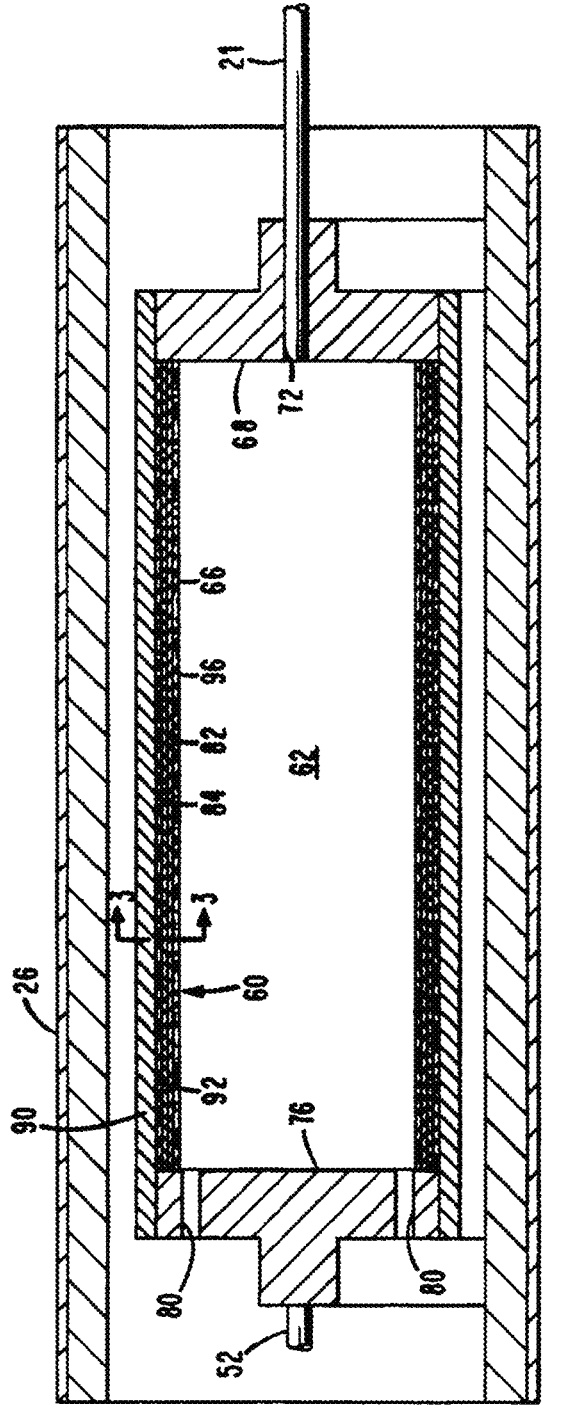
FIG. 2 is a side view in cross-section of the reactor of FIG. 1.
Figure 3:
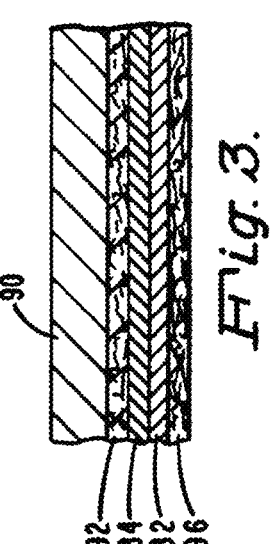
FIG. 3 is a view, enlarged to illustrate details, of a portion of the reactor of FIG. 2 showing a composite article co-deposited on a substrate.

FIGS. 2 and 3 illustrate internal details of the reactor 20 and, by way of example, a hollow graphite tube 60 positioned in its reaction chamber 62 and on whose internal surface 66 a composite article may be formed. Adjacent to one end of the tube 60 may comprise an end cap 68 having a passage 72 therein for the introduction into the reaction chamber 62 of a mixture of reactant gas and entrained particles or fibers. The opposite end of the tube may contact an end cap 76 having one or more ports 80 for removal of exhaust products from the reactor 20.

The tube 60 or other shaped structure on whose surface a chemical vapor deposition (CVD) matrix and solid particles or fibers are co-deposited to form a composite article according to the invention may comprise graphite in the form of carbon paper such as GRAFOIL paper. The carbon paper may be easily rolled into a tube and then sealed at various points along its length. If desired, two layers 82, 84 of carbon paper may be used and only the outer layer 84 removed upon completion of the co-deposition process leaving the inner layer 82 fused to the composite tube as an additional means of structural support.

The method may comprise using spark ignition to augment the chemical conversion, for example, a commercial-off-the-shelf automotive spark plug and ignition coils.

When carbon paper is utilized as the substrate for co-deposition, a hollow graphite mandrel 90 of shape similar to that of the paper may be provided to support the paper during the process of the invention, with the mandrel ends in turn being supported by the end caps 68 and 76. An annular layer 92 of felt or other flexible material may also be included between the mandrel 90 and the carbon paper tube 60 to help maintain desired dimensional restrictions and to facilitate removal of the composite article from the reactor 20 upon completion of co-deposition.

A reactant gas employed in the formation of composite articles may comprise one or more of methyltrichlorosilane, helium, hydrogen, and other gases, and mixtures thereof. The reactant gas may comprise a mixture of methyltrichlorosilane (MTS) gas (donor gas) and hydrogen gas (carrier gas), and a second phase material comprising silicon carbide particles. The mixture of reactant gas and entrained particles may be formed by introducing the particles and a carrier gas such as hydrogen from a powder feeder 22 (FIG. 1) into a stream of reactant gas carried by the line 21. The reactant gas and particles typically may be supplied to the reactor 20 at or slightly above room temperature (10-20° C.). A continuous flow of particles from the feeder 22 may be utilized to ensure a uniform build-up both of the CVD matrix produced from thermal activation of the reactant gas and of the particles which are co-deposited with the matrix. The second phase particles may include either long or short particles, or both, with selection dependent on the desired application of the composite article. Silicon carbide particles having 140-12,000 mesh such, e.g., 400-600 mesh size, may be used to form composite tubes.

In the reactor 20, the mandrel 90, heated to a temperature in the range of 1200–1450° C., in turn heats the carbon tube 60. The heated carbon tube 60 thermally activates the reactant gas, forming CVD vapors which deposit as a matrix along the interior surface of the carbon tube 60. For example, when a mixture of methyltrichlorosilane and hydrogen is employed as the reactant gas, SiC vapors and HCl gas are formed and the SiC is deposited on the inner layer 82 of carbon paper as a solid matrix. The second phase particles (e.g., the silicon carbide particles) may co-deposit randomly and generally uniformly in the matrix to form the composite deposit 96 (See FIG. 3). Exhaust products of the reaction, which may include the corrosive gas HCl and may also include hydrogen and/or chlorine, may flow out of the reactor 20 through exhaust ports 80. The reaction associated with a such co-deposition according to the present invention may be summarized as:

$$CH_3SiCl_3 + H_2 + SiC \xrightarrow{1250°\ C.} SiC + SiC +$$

(gas)    (gas)    (600 mesh particles)      (solid)    (600 mesh particles)

$$3HCl + H_2$$

(gas)    (gas)

The silicon carbide particles may be simultaneously co-deposited with the CVD silicon carbide on the surface of the carbon paper tube 60 until the desired thickness of co-deposited material is obtained. This co-deposition may occur at a high rate, for example, greater than 10 mils/hour, greater than 25 mils/hour, greater than 50 mils/hour, 10-100 mils/hour, 25-50 mils/hour, and 50-100 10 mils/hour as contrasted with less than 10 mils/hour in a conventional process depositing silicon carbide by CVD only. During the co-deposition, the carbon tube 60 and the mandrel 90 or, alternatively, the reactant gas stream, may be rotated to assure uniform deposition of the composite material along the entire circumference of the tube 60.

After co-deposition is complete, the tube 60 and composite article 96 may readily be separated from the mandrel 90 by removing the end cap 76 and sliding the tube along the mandrel. If removal of one or both layers of the carbon tube 60 is also desired, it may then be burned or sand-blasted away from the composite article 96. The resulting article, since it has the dimensions and surface finish of the carbon tube 60 or other shaped structure, should require little or no machining to produce a final product. Moreover, because of the presence of the second phase material (e.g., particles or fibers), the composite article may have greater strength and fracture toughness than a comparable CVD-only product.

Without wishing to be bound to any particular theory, it is believed that the layer thicknesses may depend on deposition time and/or gas flow rates (e.g., higher gas flow rates and longer deposition times may generate thicker layers): MTS flow rates may range from 2-10 lbs/hr; hydrogen flow rates may range from 2-60 lbs/hr; powder feed rates may range from 0-8 grams/hour; deposition temperatures may range from 1300–1500° C., such as 1300-1350° C.; and deposition pressures may range from 200-500 torr. These process conditions may be used to produce high quality optics having improved characteristics/properties described herein, although a person having ordinary skill in the art may appreciate that parameters outside these ranges and ranges of parameters normally used in CVC or CVD processes may be used to produce good to excellent results. For example, temperatures ranging from 1000° C.-1500° C., MTS flow rates range from 1-20 lbs/hr, hydrogen flow rates range from 2-90 lbs/hr and powder feed rates range from greater than 0-10 grams/hour.

Donor gases other than methyltrichlorosilane may be used to produce the composite article of interest, including gaseous mixtures of methylsilane or other chlorosilanes taken from the family of $SiCl_n H_{(4-n)}$, and other gases (inert or reactive), such as argon, helium, nitrogen, or mixtures thereof, for example, at a temperature between 800-1500° C., depending upon the various donor gas selected to undergo decomposition. Also, the present invention is not limited to a specific CVD produced material, such as CVD silicon carbide, but may include boron carbide, silicon nitride, boron nitride, oxide ceramics, silicides cermets, or any other material which may be produced by the CVD process. Thus, the scope of the matrix material which may be produced by the present invention may be limited only by the capability of the chemical vapor deposition process to produce the desired chemical composition.

Figure 4A:
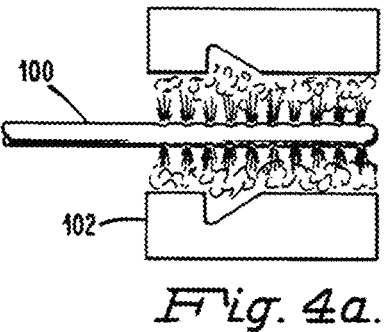
FIGS. 4A-4C are cross-sectional views illustrating steps in a method of producing composite articles by injecting a reactant gas and second phase particles or fibers entrained therein onto the interior surface of an irregularly shaped hollow mandrel.
Figure 4B:
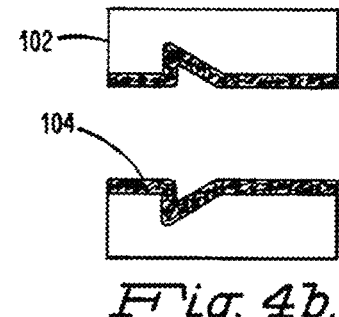
Figure 4C:
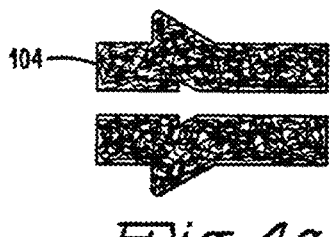

The CVD gas stream and second phase particles or fibers entrained therein may, instead of being deposited on a tube, be directed by an injector 100 onto the interior surface of a selectively shaped hollow mandrel 102 as is illustrated in FIGS. 4A-4C. Thermal decomposition of the reactant gas stream may produce a composite 104 of a CVD matrix having a generally uniform distribution of the second phase material within the matrix, which may be deposited along the interior surface of the hollow mandrel. Subsequent removal of the graphite mandrel from the composite results in a near-net shape composite 104 having a surface finish and configuration conforming to the internal surface of the mandrel. Such a process may be suitable for the manufacture of automotive engine components and jet engine components such as jet turbine vanes and other irregularly shaped articles requiring corrosion resistance, high strength, and toughness at elevated temperatures.

The method may be used to produce composite articles on the exterior surface of a mandrel, rather than the interior surface, when such a final surface configuration is desired. The surface upon which the CVD material is to be deposited may be thermally activated to initiate and drive the decomposition process of the donor gas, and may be compatible with the gases and solid phase material to which it is exposed. Deposition of CVD produced material with solid particles suspended therein may be directed onto flat, square, rectangular, cylindrical, and spherical or aspherical substrates. Such a composite layer of CVD matrix and second phase particles uniformly and randomly disposed therein may provide a hard, impact and corrosion-resistant covering for otherwise soft materials that may be susceptible to chemical attack. Hence, inexpensive substrates may be manufactured into a final desired embodiment and then subjected to the disclosed method. The method may be suitable for applications where tungsten, molybdenum, or any type of carbon product is so utilized.

The present invention may comprise a process in which the underlying material may be fabricated into a desired shape, such as a coil, wire or a more complex configuration such as a vane, turbo rotor, rocker arm, or other engine component. The shaped substrate may be then maintained at an elevated temperature, thereby providing the thermal activation for the decomposition of the donor gas. The exact temperature range may be dependent upon the ultimate CVD matrix composition selected. A gaseous mixture containing the donor gas, a carrier gas, and particles or fibers of the second phase material may then injected onto and over the heated substrate. For example, a stream of methyltrichlorosilane and hydrogen may be injected into the CVD chamber accompanied by a simultaneous flow of silicon carbide particles of 400-600 mesh. The heated methyltrichlorosilane may react with the hydrogen to produce silicon carbide which is co-deposited along with the entrained silicon carbide particles onto the underlying substrate. The coated article thus produced may contain a shaped underlying substrate fused to a CVD produced silicon carbide matrix having a uniform and random distribution of silicon carbide particles embedded therein.

The method may also include post treating with helium, hydrogen, or other gas(es). The heat treatment atmosphere, temperature, and/or treatment duration may minimize or eliminate micropores and elemental species, and reduce the grain size/number of scattering sites. Without wishing to be bound to any particular theory, it is believed that the post treatment may change the crystal size of the coated article to improve the optical and/or mechanical properties. The post treatment may comprise providing the coated article in a furnace having a temperature from 1500-3000° C. for up to several hundred hours.

Any material may be selected as the underlying substrates so long as it does not decompose at the required CVD temperature nor become subject to corrosive attack by the gases produced upon decomposition of the donor gas. It should be noted in this regard that the decomposition of methyltrichlorosilane occurs at a temperature between 1200-1350° C., producing highly corrosive hydrochloric acid which may easily eat away a plethora of common substrate materials. However, since the process of the invention is not solely directed at the decomposition of methyltrichlorosilane into silicon carbide, but instead may be used with any matrix which may be produced through chemical vapor deposition, there may be a plurality of processes in which less corrosive gases may be produced at less or more elevated temperatures. In such processes, a broad range of materials may be incorporated as the underlying substrate without resulting in decomposition or corrosion during application of the disclosed process.

Although the examples described above utilize silicon carbide as the CVD material, the co-deposited composite article technology may be applied to other materials which may be produced through the chemical vapor deposition process. Among the ceramics which may be used include silicon nitride, silicon oxides, boron nitride, boron carbide, cermets, and silicides. The present invention additionally anticipates co-deposited composites having a ceramic matrix and second phase material, with the ultimate composition dependent upon the temperature and type of environment for which the ceramic composite is desired. Hence, a CVD silicon carbide matrix having boron carbide particles or fibers embedded within the matrix, may be a simpler and less expensive means for producing, for example, nuclear components.

The silicon carbide powder may be characterized as gem grade. The composite article may comprise a fine silicon carbide powder, measuring between 140-12,000 mesh, such as 400-600 mesh, and of the quality usually used in polishing operations which is entrained in a gaseous stream of methyltrichlorosilane and hydrogen as may normally used to produce CVD silicon carbide. In tests of this process, with deposition onto a graphite tube in thermal contact with a mandrel maintained at a temperature of 1250° C., a higher deposition rate of silicon carbide may be achieved, resulting in the co-deposition of 50 mils/hour of CVD silicon carbide and silicon carbide powder as opposed to the usual 10 mils/hour of CVD silicon carbide under a conventional CVD process. Moreover, in certain environments, co-deposition rates up to 100 mils/hour of CVD silicon carbide and silicon carbide powder may be achieved. Without wishing to be bound by any particular theory, this unexpectedly high deposition rate may be an advantage in the manufacture of composite articles as it reduces manufacturing lead times, an important facet of production for critical components.

Figure 5:
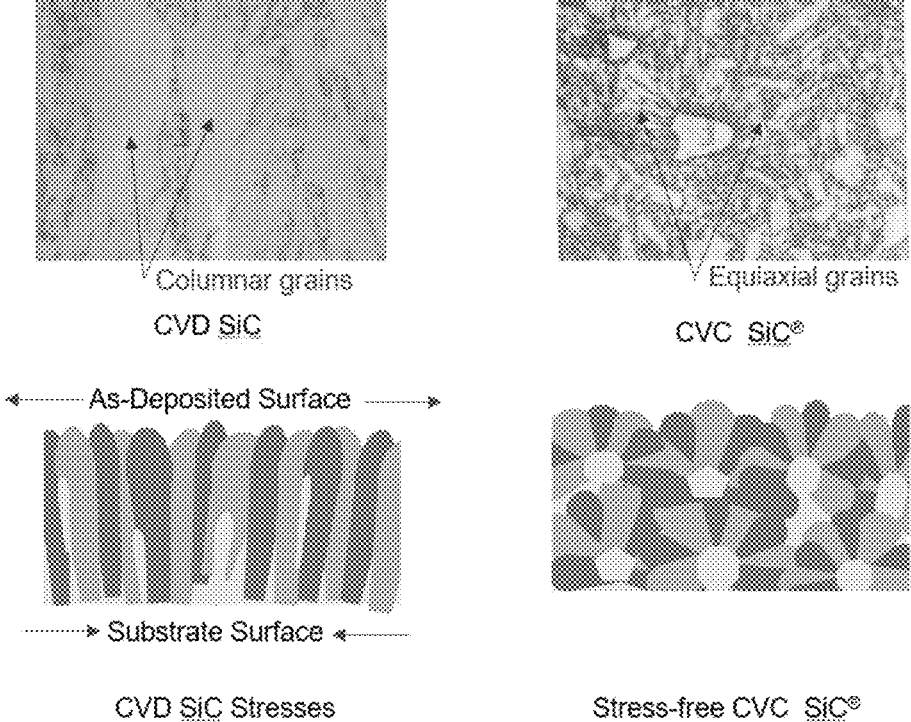
FIG. 5 illustrates anisotropic CVD SiC grains of a conventional composite article and isotropic CVC SiC grains of a composite article produced according to the present invention.

Referring to FIG. 5, a microstructure of a composite article resulting from the entraining of silicon carbide particles in a methyltrichlorosilane and hydrogen mixture is illustrated. The second phase silicon carbide particles co-deposited along with the CVD produced silicon carbide are shown as white dots uniformly dispersed throughout the silicon carbide matrix. No unusual grain growth nor uneven distribution of silicon carbide particles is shown. Moreover, no particular damage, such as isotropic grain growth, exaggerated grain growth, porosity, delamination, and/or cracking, for example, is shown, which may be an improvement over conventional processes since the ceramic matrix forms directly from the gas phase independent of any reaction with the entrained particles.

A composite sample produced according to the present invention may use three times as much voltage and twelve times as much time to etch as compared to a conventional CVD silicon carbide sample. Without wishing to be bound to any particular theory, this may suggest that the composite had unexpectedly superior resistance to corrosion. Co-deposited composite articles produced by the present invention may also have enhanced fracture and corrosion resistance without any degradation of strength compared to a conventional CVD silicon carbide sample.

Figure 6:
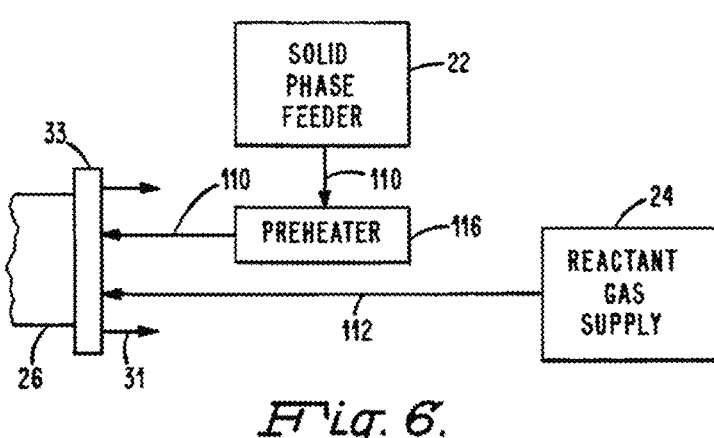
FIG. 6 is a schematic view of a portion of an apparatus for practice of the method of the invention.

According to the present invention, the solid particles or fibers may be entrained in the reactant gas outside the reactor 20 to form a mixture which may be introduced to the reactor 20 as a single stream. FIG. 6 shows a system according to the invention in which the solid phase material and carrier gas may be directed to the reactor 20 along a line 110 separate from the line 112 carrying the reactant gas. The system may comprise a preheater 116 between the feeder 22 and the reactor 20 to heat the solid phase material to a selected temperature, for example, to a temperature as high as the deposition temperature of the substrate within the reactor 20. Such preheating of the particles or fibers prior to their introduction into the reactor 20 enhances the thermal activation of the reactor gas in the reactor 20 and may produce higher co-deposition rates, greater uniformity of the composite material, and/or enhanced mechanical properties of the resulting composite article than may be achievable by use of a single stream of reactant gas and solid phase material. Also, a suitable device (not shown) for mixing the solid phase material and/or reactant gas(es) before or within the reactor 20 may be provided as part of this system. Such pre-mixing of gas(es) and particles or fibers prior to their introduction into the reactor 20 may speed the chemical reaction and resultant deposition once introduced to the reactor 20 and improve mechanical properties and co-deposition rates. Without wishing to be bound to any particular theory, it is believed that preheating a combined stream of reactant gas and entrained solid phase material may be limited by the desire to avoid premature thermal activation of the reactant gas which may lead to deposition in, and clogging of, a supply line or injection nozzle through which the reactants may be supplied to the reactor 20.

By extension, the process of the present invention may be used to manufacture: optical structure components (telescope structure components) that may have one or more of the characteristics described listed above; ceramic components for space, semiconductor, nuclear or military applications; optics, optical structures, missile nose cones, DACS liners (divert attitude control systems), shuttle tiles, wing leading edges, thermal propulsion components and other products for the space industry; process components for wafer fabrication manufacturing and other products for the semiconductor industry; fuel cladding rods and other products for the nuclear industry; armor (vehicle or personal), gun barrel liners, missile/tactical optics and associated optical structures and other products for the military industry; and lens molds or other similar surface replication applications.

Benefits of the present invention may include one or more of the following: near net shape forming of the optical surface, including exotic geometries such as aspheres, off-axis aspheres, nose cones, nozzles, wing leading edges, and frustums; optical finish of CVD SiC may not be subject to particle pull-out which may result in light scattering; other advantages of CVD SiC may be retained, including high specific stiffness, high thermal conductivity, and/or low thermal expansion; and small optical components, including lens molds for surface replication, may be made with CVD SiC layers greater than 4 mm.

The present invention may comprise a process for making transparent and/or translucent CVC SiC and/or CVD SiC articles. As generally used herein, the term "transparent" refer to allowing visible wavelengths (380-740 nm) to pass through; and the term "translucent" refers to allowing other wavelengths to pass through, such as radio waves, microwaves, infrared, ultraviolet, X-rays, and gamma rays, for example, ultraviolet wavelengths (10-400 nm) and infrared wavelengths (700 nanometers to 1 mm).

Figure 7:
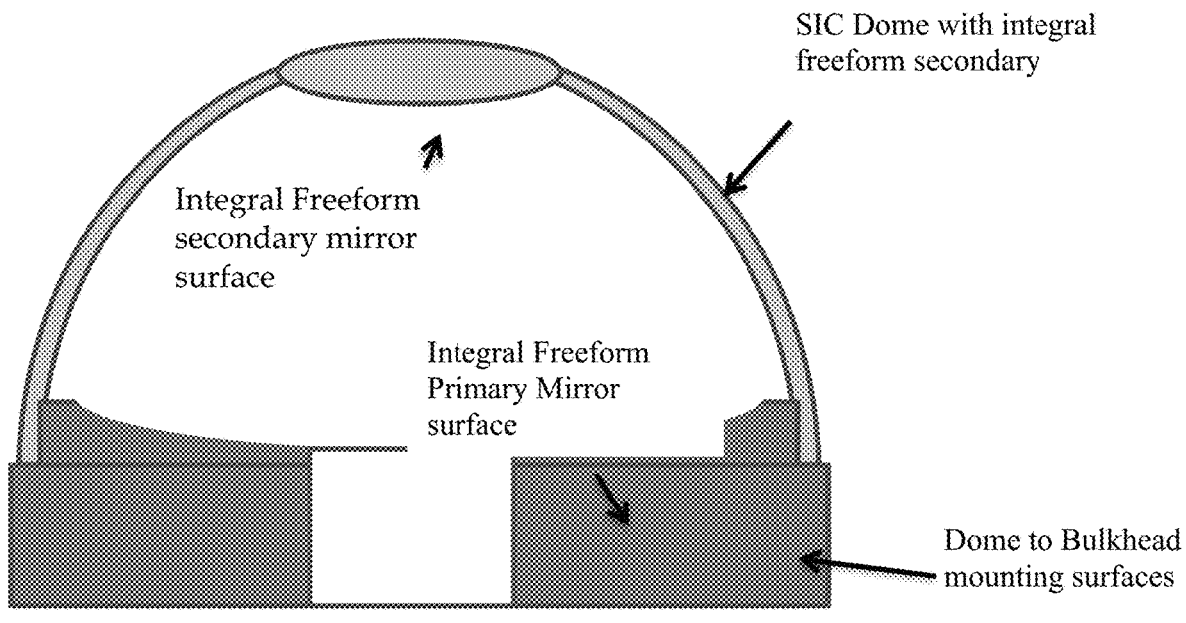
FIG. 7 is a composite article made according to the present invention.
Figure 7:
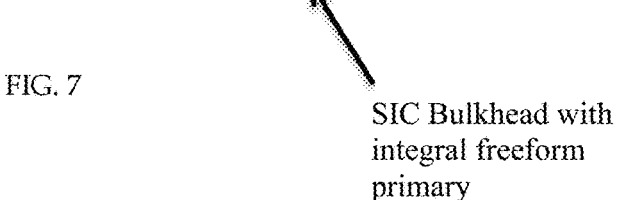

The present invention may comprise a process for making CVC SiC and/or CVD SiC into conformal shapes for use in nose cones (see FIG. 7) and conformal shapes including various windows and other structures including aerodynamic surfaces and control surface shapes for missile, aerospace, hypersonics and other applications. As shown in FIG. 7, the conformal shape may comprise a first surface and an opposed second surface. The first surface may comprise a machined outer surface and the opposed second surface may comprise an inner surface polished to a high optical finish.

As shown in FIG. 7, the aerodynamic surface may comprise a SiC bulkhead with integral freeform primary, at least one dome to bulkhead mounting surface, and a SiC Dome with integral freeform secondary, an integral freeform primary mirror surface and an integral freeform secondary mirror surface.

The present invention is directed to a process for making a nose cone (see FIG. 7) or other structure and integrating one or more optical surfaces on the opposite (inside) surface from the aerodynamic surface into a single structure to reduce the complexity of the design and number of components needed for the optical instrument/telescope.

The present invention is directed to a process to polish the optical surface using free form polishing of the CVD or CVC SiC to improve the optical performance of the telescope and reduce the number or optical surfaces from current design requirements that necessitate three or more optical surfaces/mirrors.

Benefits of the present invention may include a simpler design characterized by one or more of the following: less components; less obscurations; cheaper manufacturing and/ or shorter lead time; easier alignment; same or better optical performance; higher temperature application capability; faster fabrication; and integral mounting feature of the optical surface and therefore registration of optical surfaces and both the aerodynamic surface and other features leading to a bolt together design capability not needing adjustment using shims etc.

Ceramics, both glassy and crystalline, have utility as optically transparent materials in optical fibers for guided lightwave transmission, optical switches, laser amplifiers and lenses, hosts for solid state lasers and optical windows for gas lasers, infrared (IR) heat seeking devices for missile guidance systems and IR night vision.

Recent advances in ceramic manufacturing, e.g., the use of nanomaterials, have brought ceramics to the fore in applications such as radomes, IR domes, sensor protection and multi-spectral windows. Optical properties of ceramics control the spectral bandwidth over which the optic may operate. These ceramics may benefit from high abrasion resistance and strength for armor applications as well as high thermal stability due to the military/aircraft environment in which they operate.

While silicon carbide is typically thought of as opaque, this optical property may be a result of impurities or other scattering features within the material. Moissanite is a gemological/mineralogical form of silicon carbide and is sometimes used for jewelry to simulate diamonds. As shown in FIG. 5, the potential transmission capability of silicon carbide as a window or radome material may offer appreciable increased thermal and mechanical performance.

Passive missile guidance systems, also called "heat seekers", use electromagnetic radiation from the target in the IR spectrum for tracking. For instance, the American Terminal High Altitude Area Defense (THAAD) is a mobile anti-ballistic missile defense system designed to intercept short-, medium- and intermediate-range ballistic missiles in the terminal phase (descent/reentry). Hypersonic weapons combine the speed of ballistic missiles with the maneuverability of cruise missiles and are specifically designed for survivability against current ballistic missile defense systems. Conventional re-entry vehicles (RVs) are limited to speeds between Mach 1 and Mach 5 due to the steep trajectories of launch and re-entry and are traceable and interceptable due to their predictable flight path. By contrast, hypersonic weapons travel along the edge of space, can accelerate to between Mach 5 and 10, and are capable of maneuvering in flight, allowing them to bypass modern layered ballistic missile defense systems. THAAD and hypersonic interceptors may benefit from state of the art transparent/translucent optics—specifically windows and radomes—and improved mechanical and thermal properties to operate and respond within these environments.

The present invention is directed to improving the transparent performance of scalable CVC SiC for THAAD and Hypersonic window and radome applications among other applications such as radomes, IR domes, sensor protection and multi-spectral windows. Without wishing to be bound to any particular theory, it is believed that at least one of the following may affect the optical properties of the SiC material: hydrogen to methyltrichlorosilane (MTS) ratio, chamber pressure, secondary particles and thermal decomposition of MTS, and post deposition heat treatment.

The hydrogen to MTS ratio may contribute to the silicon to carbon ratio and enable tuning for stoichiometric SiC. This ratio may also influence the matrix grain size, which may influence optical scattering. The present invention may include a hydrogen to MTS ratio having a lower limit of 5 and an upper limit of at least 10, such as from 5-15 and 6-11, for example.

The chamber pressure or vacuum may contribute to the grain size of the material as well. Without wishing to be bound to any particular theory, it is believed that a pressure below 350 torr, such as 10-30 torr, may increase the optimal transparency of the material.

Conventional materials may comprise heterogenous CVC SiC composite materials, which may contribute to optical scattering. In contrast, the present invention may comprise homogeneous materials having less optical scattering relative to such conventional materials. The present invention may comprise the addition of secondary particles that are consistent with the composition of the material matrix. Also, the particle size and particle size distribution, as well as the particle introduction mechanism of the present invention may be configured or selected to maximize the resultant transparency.

Without wishing to be bound to any particular theory, it is believed that the MTS decomposition reaction may include multiple intermediate reaction steps, some of which require higher activation energy. Some of the lower energy intermediate steps favor silicon production. The present invention may comprise adding an electrical and/or thermal ignition source to the chamber to encourage complete MTS decomposition and favor stoichiometric SiC, and may also affect the final grain size.

Without wishing to be bound to any particular theory, it is believed that heat treatment may contribute to grain size, and remove grain boundary micropores and/or trapped elements, all of which may influence optical scattering. By adjusting the heat treatment atmosphere, temperature, and/or treatment duration, micropores and elemental species may be minimized or eliminated, and grain size/number of scattering sites may be reduced. Without wishing to be bound to any particular theory, it is believed that the heat treatment may produce composite articles characterized by being reflective and transparent and/or translucent. The present invention may comprise processing in pure helium and hydrogen atmospheres, at a variety of temperatures, e.g., from 1500-3000° C., and at different dwell durations, e.g., 4-7 weeks, 650-1200 hours, or 250-1000 hours.

The present invention may comprise chemical vapor composite silicon carbide having an inherently stress-free, radiation hardened ceramic composite useful for space and/ or missile applications. The CVC process may comprise a chemical vapor deposition process having an aerosol of solid micron-scale particulates entrained within the high purity reactant gas stream. The gas/particulate mixture may be injected into a high temperature furnace where it reacts on a heated graphite mandrel to form solid CVC SiC. The second phase particulates may act as seeds for new growth and engender constant re-nucleation of the grain structure (i.e., equiaxial grain structure), which may prohibit the formation of the compressive and tensile stresses observed of long columnar CVD-type grains. FIG. 5 shows optical microscope images and illustrations of anisotropic CVD SiC grains and isotropic CVC SiC grains. The CVD columnar grains are oriented normal to the mandrel and tensile stresses are greatest at the base of the deposit where the grains are smallest. As a result, the deposited material tends to bow towards the substrate-deposit interface and is prone to fracture in the as-deposited state or during machining. The equiaxial grain structure of the CVC is isometric, which may discourage formation of compressive and tensile stresses. Consequently, the CVC is intrinsically stress-free, enabling deposition of conformal geometries (i.e., near net shape deposition), thick monoliths (up to 63 mm with potential for thicker blanks), 5× faster growth rates than CVD, and machining to thin dimensions with reduced risk of fracture. Near net shape refers to a manufacturing technique in which the initial production of a component is very close to the final (net) shape of the component. Near net shape manufacturing may reduce traditional finishing, such as machining or grinding, and thereby provide a more efficient and/or cost effective manufacturing process.

The present invention may provide certain benefits relative to conventional materials, such as, reduced manufacturing lead times, faster growth rates, increased reliability, increased yield, and near net-shaping at reduced cost, risk and schedule for CVC optics and structures. CVC SiC according to the present invention may be deposited on a mandrel that is close to the final geometry, thereby reducing the amount of material required to yield the final form. Savings may be realized in the form of reduced deposition and fabrication time and minimal machining requirements. By reducing the manufacturing lead times, the conformal CVC SiC process according to the present invention may reduce production and machining costs. Machining may account for up to 50% of the component cost, a figure that may be significantly reduced by near net shaping.

The machining process may introduce subsurface damage into the workpiece. By reducing the amount of material to be removed through near net shaping, the present invention may reduce the amount of subsurface damage. A structural component without subsurface damage may be a more reliable component.

Near net shaping according to the present invention may provide greater flexibility in mandrel geometry, thereby increasing the effective usable reactor real estate and the capability for volume production. Manufacturing yields may also increase the CVC SiC is inherently stress-free and less prone to fracture.

The present invention may comprise one or more of the following aspects:

Aspect 1. A method of forming a transparent composite article comprising: forming a mixture of (i) a reactant gas stream comprising hydrogen and methyltrichlorosilane and (ii) solid silicon carbide particles having a 140-12,000 mesh size; heating a carbon substrate to a temperature from 1300-1500° C. in the reactor having a pressure from 10-30 torr; heating the mixture of the reactant gas stream and solid silicon carbide particles to a temperature greater than 1200°

C. sufficient to decompose the methyltrichlorosilane to produce silicon carbide material without causing the solid silicon carbide particles to react and injecting the heated mixture into the reactor; co-depositing the silicon carbide material and the solid silicon carbide particles onto the heated carbon substrate in the reactor to produce a CVD matrix comprising the silicon carbide material and the solid silicon carbide particles by chemical vapor deposition on the heated carbon substrate; post-treating the carbon substrate having the CVD matrix coating in a furnace having a temperature from 1500-3000° C. and an atmosphere comprising at least one of helium and hydrogen for up to several hundred hours; and cooling and removing the carbon substrate from the CVD matrix to form the transparent composite article; wherein the reactant gas stream comprises a flow rate from about 2-10 lbs/hr of the methyltrichlorosilane and a flow rate from about 2-60 lbs/hr of the hydrogen; wherein the solid silicon carbide particles have a feed rate up to 8 g/hr; and wherein the composite article is transparent to visible light.

Aspect 2. The method of Aspect 1, wherein the composite article is translucent to at least on of ultraviolet radiation and infrared radiation.

Aspect 3. The method of any of the foregoing aspects comprising contacting the carbon substrate having the CVD matrix coating and at least one of helium and hydrogen.

Aspect 4. The method of any of the foregoing aspects, wherein the silicon carbide comprises moissanite having a purity greater than 10 ppm.

Aspect 5. The method of any of the foregoing aspects, wherein the reactant gas stream comprises a ratio of hydrogen to methyltrichlorosilane from 6-11.

Aspect 6. The method of any of the foregoing aspects, wherein heating the mixture of the reactant gas stream comprises decomposing the methyltrichlorosilane using one of electrical ignition and thermal ignition.

Aspect 7. The method of any of the foregoing aspects, wherein the transparent composite article comprises equiaxial grain structure.

Aspect 8. The method of any of the foregoing aspects, wherein the transparent composite article comprises a grain size less than 100 micrometers.

Aspect 9. The method of any of the foregoing aspects, wherein the transparent composite article comprises a thickness greater than 3 mm.

Aspect 10. The method of any of the foregoing aspects, wherein the transparent composite article comprises a ratio of silicon to carbon from less than 60:40.

Aspect 11. The method of any of the foregoing aspects, wherein the transparent composite article comprises equiaxial grain structure, a grain size from 10-100 micrometers, a thickness from 3-10 mm, and a ratio of silicon to carbon from 50:50-60:40.

Aspect 12. The method of any of the foregoing aspects, wherein the transparent composite article is intrinsically stress free and lacks subsurface microcracks, dislocation, and deformation (curling, and/or warping) due to residual stresses as measured by the variation from a flat surface or by the degree of cracking from the surface through the thickness of the transparent composite article.

Aspect 13. The method of any of the foregoing aspects, wherein the transparent composite article lacks substantial particle pull out as measured by white light interferometry and lacks substantial light scattering as measured by white light interferometry.

Aspect 14. The method of any of the foregoing aspects, wherein the CVD matrix has a thickness greater than 3 mm.

Aspect 15. The method of any of the foregoing aspects, wherein the transparent composite article has a stiffness greater than 140 kN-m/g, a thermal conductivity greater than 180 W/m-K, and a coefficient of thermal expansion greater than $2\times10^{-6}$/K.

Aspect 16. The method of any of the foregoing aspects, wherein the transparent composite article has a fracture resistance from 3.0-3.4 MPa-m$^{'12}$ (when measured by single-edge V-notched beam method and an Instron universal tester with a 4-point flexure fixture in which CVC bars are loaded into the Instron and pressure is applied at 4 point until the bars break), an improved corrosion resistance relative to conventional semiconductor ceramics in OEM manufacturing etch environments, and a tensile strength from 40.7-54.7 ksi (2810-377 MPa)(when measured by ASTM 1273 using an Instron universal tester in which an hour-glass sample is affixed at each end and the sample is pulled apart until it breaks), a compressive strength from 403-824 ksi (2.78-5.68 MPa)(when measured by ASTM C1424 using an Instron universal tester in which an hour-glass sample is affixed at each end and the sample is pulled apart until it breaks), and an average bi-axial strength from 32.2-34.2 ksi in water and 37.7 ksi in air (when measured by ASTMs C1368 and 1499 using an Instron universal tester in which a disc shape sample is placed under pressure and slow crack growth is characterized in air and water, respectively).

Aspect 17. The method of any of the foregoing aspects, wherein the carbon substrate comprises a conformal shape selected from an exhaust duct shape, a nozzle shape, a fan cowl shape, a thrust reverser shape, an auxiliary power unit shape, a fuselage shape, a tapered wing skin shape, or a nose cone shape or similar geometry.

Aspect 18. The method of claim any of the foregoing aspects, wherein the composite article is reflective.

Aspect 19. The method of any of the foregoing aspects, wherein the composite article is reflective to at least a portion of wavelengths from radio waves, microwaves, infrared, visible light, ultraviolet, X-rays, and gamma rays.

Aspect 20. A composite article manufactured according to any of the foregoing aspects.

The following references may provide additional information describing or related to the present invention: U.S. patent application Ser. Nos. 06/837,113, 07/941,290, 12/799,599, 13/065,042, 14/121,049, 14/120,042, 14/757,276, 14/757,279, 14/998,656, 61/214,786, 61/339,851, 61/214,786, 62/124,231, 62/124,232, 62/125,726, and 62/295,956.

All documents cited herein are incorporated herein by reference, but only to the extent that the incorporated material does not conflict with existing definitions, statements, or other documents set forth herein. To the extent that any meaning or definition of a term in this document conflicts with any meaning or definition of the same term in a document incorporated by reference, the meaning or definition assigned to that term in this document shall govern. The citation of any document is not to be construed as an admission that it is prior art with respect to this application.

While particular embodiments have been illustrated and described, it would be obvious to those skilled in the art that various other changes and modifications may be made without departing from the spirit and scope of the invention. Those skilled in the art will recognize, or be able to ascertain using no more than routine experimentation, numerous equivalents to the specific apparatuses and methods described herein, including alternatives, variants, additions, deletions, modifications and substitutions. This application including the appended claims is therefore intended to cover all such changes and modifications that are within the scope of this application.

What is claimed is:

1. A transparent composite article comprising:
   a first domed surface having a first integral freeform mirror and an opposed second surface having a second integral freeform primary mirror and supporting the first domed surface;
   wherein the first domed surface and opposed domed surface each comprise a chemical vapor deposition (CVD) matrix comprising a silicon carbide material having 140-12,000 mesh solid silicon carbide particles dispersed therein;
   wherein the CVD matrix is transparent to visible light; and
   wherein the CVD matrix comprises a columnar grain structure.

2. The transparent composite article of claim 1, wherein at least one of the first domed surface and the opposed second surface comprise an integral mounting feature configured to couple the at least one of the first domed surface and the opposed second surface to a bulkhead of the transparent composite article.

3. The transparent composite article of claim 1, comprising an aerodynamic surface opposed to at least one of the first domed surface and the opposed second surface.

4. The transparent composite article of claim 1, comprising up to two mirrors.

5. The transparent composite article of claim 1, configured for use in environments having a temperature from 1500-3000°.

6. The transparent composite article of claim 1, wherein the CVD matrix is formed independent of any reaction with the solid silicon carbide particles.

7. The transparent composite article of claim 1, wherein the silicon carbide material comprises moissanite having a purity greater than 10 ppm.

8. The transparent composite article of claim 1, wherein the silicon carbide material comprise fibers.

9. The transparent composite article of claim 1, wherein the solid silicon carbide particles comprise 400-600 mesh size.

10. The transparent composite article of claim 1, wherein the CVD matrix has a thickness greater than 3 mm.

11. The transparent composite article of claim 1, wherein the CVD matrix comprises a grain size less than 100 micrometers.

12. The transparent composite article of claim 1, wherein the CVD matrix comprises a ratio of silicon to carbon from less than 60:40.

13. The transparent composite article of claim 1, wherein the CVD matrix is translucent to at least one of ultraviolet radiation and infrared radiation.

14. The transparent composite article of claim 1, wherein the transparent composite article comprises equiaxial grain structure, a grain size from 10-100 micrometers, a thickness from 3-10 mm, and a ratio of silicon to carbon from 50:50-60:40.

15. The transparent composite article of claim 1, wherein the transparent composite article is intrinsically stress free and at least partially lacks subsurface microcracks, dislocation, and deformation due to residual stresses as measured by the variation from a flat surface or by the degree of cracking from the surface through the thickness of the transparent composite article.

16. The transparent composite article of claim 1, wherein the transparent composite article at least partially lacks substantial particle pull out as measured by white light interferometry and lacks substantial light scattering as measured by white light interferometry.

17. The transparent composite article of claim 1, wherein the transparent composite article has a stiffness greater than 140 kN-m/g, a thermal conductivity greater than 180 W/m-K, and a coefficient of thermal expansion greater than $2\times10^{-6}$/K.

18. The transparent composite article of claim 1, wherein the transparent composite article has a fracture resistance from 2.75-4 MPa-m$^{1/2}$, a tensile strength from 35-60 ksi, a compression strength from 360-900 ksi, and a bi-axial strength in water from 27-37 ksi.

19. The transparent composite article of claim 1, wherein the transparent composite article comprises a conformal shape selected from an exhaust duct shape, a nozzle shape, a fan cowl shape, a thrust reverser shape, an auxiliary power unit shape, a fuselage shape, a tapered wing skin shape, or a nose cone shape or similar geometry.

20. The transparent composite article of claim 1, wherein the transparent composite article is reflective to at least a portion of wavelengths from radio waves, microwaves, infrared, visible light, ultraviolet, X-rays, and gamma rays.

\* \* \* \* \*